United States Patent
Takano et al.

[11] Patent Number: 5,373,805
[45] Date of Patent: Dec. 20, 1994

[54] SINGLE CRYSTAL PULLING APPARATUS

[75] Inventors: Kiyotaka Takano; Izumi Fusegawa; Hirotoshi Yamagishi, all of Annaka, Japan

[73] Assignee: Shin-Etsu Handotai Co., Ltd., Tokyo, Japan

[21] Appl. No.: 961,764

[22] Filed: Oct. 15, 1992

[30] Foreign Application Priority Data

Oct. 17, 1991 [JP] Japan .................. 3-298028
Oct. 30, 1991 [JP] Japan .................. 3-310106

[51] Int. Cl.$^5$ ............................... C30B 15/20
[52] U.S. Cl. .......................... 117/18; 117/13; 117/208; 117/214
[58] Field of Search ............. 156/617.1, 618.1, 620.4, 156/DIG. 83, DIG. 115; 422/249, 253

[56] References Cited

U.S. PATENT DOCUMENTS

| | | | |
|---|---|---|---|
| 4,330,361 | 5/1982 | Kahn-Kuhnenfeld et al. | 422/249 |
| 4,330,362 | 5/1982 | Zulehner | 156/617.1 |
| 4,956,153 | 9/1990 | Yamagishi et al. | 422/249 |
| 4,957,713 | 9/1990 | Kravetsky et al. | 422/249 |
| 4,981,549 | 7/1991 | Yamashita et al. | 156/617.1 |
| 5,129,986 | 7/1992 | Seki et al. | 422/249 |
| 5,196,173 | 3/1993 | Arai et al. | 422/249 |

*Primary Examiner*—R. Bruce Breneman
*Assistant Examiner*—Felisa Garrett
*Attorney, Agent, or Firm*—Whitham, Curtis, Whitham & McGinn

[57] ABSTRACT

A single crystal pulling apparatus based on Czochralski technique having a conduit for continuously supplying granular polycrystal material to the crucible and a vertical purge tube suspended centrally into the heating chamber, wherein the purge tube is vertically shiftable; a heat shield ring is connected to the lower end of the purge tube, and a cylindrical quartz partition ring made of a quartz glass containing no bubbles is held vertically by the heat shield ring in a manner such that the lower end of the quartz partition ring comes substantially lower than the lower end of the purge tube so that, by being dipped in the polycrystal melt, the partition ring isolates the interior surface of the melt from the exterior surface of the melt, over which latter the granular polycrystal material is poured.

10 Claims, 3 Drawing Sheets

SINGLE CRYSTAL PULLING APPARATUS

BACKGROUND OF THE INVENTION

The present invention relates to a single crystal pulling apparatus for growing and pulling up a single crystal ingot from molten liquid of a polycrystal substance based on the Czochralski (CZ) technique.

Such a single crystal pulling apparatus comprises a heating chamber wherein a single crystal is grown from polycrystal substance (a raw material such as silicon); in the heating chamber are provided such elements as a quartz crucible, a cylindrical heater surrounding the crucible, and a cylindrical thermal insulator (heat shield) surrounding the heater. Beneath the heating chamber are provided mechanisms for rotating the crucible about a vertical crucible shaft, on which the crucible is fixedly mounted, to control the uniformity of the heat flux in the molten polycrystal substance during the crystal growing operation.

The polycrystal substance charged in the quartz crucible is heated and melted down by the heater to turn into a polycrystal molten liquid (melt), and in this liquid is dipped a seed crystal fixed at the lower end of a pull means such as a wire, and the desired single crystal grows from the seed crystal as the pull means is rotated and drawn up at predetermined rates together with the seed crystal.

(Problems the Invention seeks to solve)

In such a conventional CZ technique type single crystal pulling apparatus, the resistivity gradually decreased with the progress of the growing operation due to segregation of the dopants; thus, the resistivity distribution in the ingot tended to be such that the closer to the bottom of the ingot, the lower was the resistivity. As the result, the occurrence rate of off-specification wafer was relatively high. For this reason, a continuous charge method has been adopted, according to which a measured amount of granular polycrystal substance is continuously poured over the melt in the quartz crucible while the single crystal ingot is pulled up.

However, the powdery polycrystal substance floats on the surface of the melt as the granular polycrystal substance is poured over the melt, and there is a strong tendency that the natural convection in the free surface of the melt carries the powdery polycrystal substance toward the single crystal from the crucible, and as the result, the powdery polycrystal substance enters the solid/melt (growth) interface of the single crystal thereby causing dislocations in the single crystal.

Also, owing to the temperature difference between the granular polycrystal substance and the melt, localized temperature gradients are created in the melt resulting in dislocations in the single crystal.

Therefore, it is impossible to grow a flawless single crystal using a single crucible; for this reason, the duplex crucible method has been adopted, according to which a cylindrical internal crucible is concentrically provided in the quartz crucible to form a duplex structure, and an appropriate amount of granular polycrystal substance is poured outside the internal crucible in a continuous manner. This duplex structure provides a shield such that the surface convection caused by heat cannot carry the powdery polycrystal toward the single crystal ingot to thereby prevent the dislocation in the single crystal caused by floating polycrystal powder.

However, in this conventional duplex crucible method, the internal crucible was fixed to the external crucible by welding or by some other means so that the internal crucible was immovable relative to the external crucible, and as such the internal crucible was always submerged in the melt; for this reason, the internal crucible had to be made of a special material and fixed to the external crucible with high technology so that it could undergo thermal deformation without breaking and detaching from the external crucible, and this made the cost for providing the internal crucible very high.

Thus, in place of the internal crucible, a cylindrical partition is provided and is dipped in the melt, separating the melt surface into the internal single crystal growth region and the external raw material supply region. This partition also prevents the powdery polycrystal from being carried toward the single crystal ingot to thereby prevent the dislocation in the single crystal, and furthermore the partition prevents the thermal disorder in the melt in the vicinity of the single crystal so as to further minimize the crystal dislocation (ref. Japanese Patent Kokoku No. 59-50627).

As the material for the cylindrical partition, silicon nitride or opaque quartz glass has been used; however, silicon nitride is over expensive, and the opaque quartz glass, which is of the same material as is used to make the crucible, contains bubbles in it so that when the partition is dipped in the super-hot melt, the bubbles expand in the quartz glass whereby that part of the partition which is dipped in the melt undergoes severe corrosion and degradation, and fragments of corroded quartz glass fall on the melt surface on which it floats and reach the growth interface to interfere with the smooth single crystallization.

Also, with the structure of the conventional single crystal pulling apparatus, since there was no shield between the melt surface and the inner walls of the heating chamber, the heat of the melt was radiated directly to the inner walls of the heating chamber; thus, the melt surface, especially the interface joining the internal crucible and the melt surface, cooled and the melt tended to solidify at the interface and, as the result, it was difficult to increase the single crystal growth rate. Furthermore, the silicon monoxide (SiO) evaporating from the melt surface deposited itself on the inner walls of the chamber and eventually caused dislocations in the growing crystal.

There is a control method called melt amount reduction type control method, in which the melt amount is reduced as the single crystal is pulled up so as to control the dopant concentration in the single crystal. In the case of adopting such control method, the area by which the melt contacts the crucible is reduced so that in proportion to this the amount of the oxygen that dissolves into the melt from the crucible is reduced and as the result the oxygen concentration of the single crystal gradually decreases with the crystal growth, making the single crystal biased.

The present invention was made in view of the above problems, and it is, therefore, an object of the invention to provide a single crystal pulling apparatus which is designed such that it can produce high quality single crystal ingots having scarce dislocation at high productivity, and such that the life of the crucible is extended greatly to reduce the running cost.

SUMMARY OF THE INVENTION (Means to solve the Problems)

In order to attain the above objects, the present invention proposes an improved single crystal pulling apparatus of Czochralski technique type for growing and pulling up a single crystal ingot from a polycrystal melt contained in a quartz crucible provided in a heating chamber, in which are also provided a heater, a thermal insulator, a conduit for continuously supplying granular polycrystal material to the crucible, and a vertical purge tube suspended centrally into the heating chamber from above to provide a passage for a purge gas. In this improved single crystal pulling apparatus:

the purge tube is vertically shiftable;

a heat shield ring concentric with the purge tube is connected to the lower end of the purge tube, the heat shield ring having a shape of a truncated cone expanding upward from the lower end where it is connected to the purge tube such that the inclined outer face forms a substantial angle with horizontal plane; and a cylindrical quartz partition ring concentric with the purge tube and made of a quartz glass containing no bubbles therein is held vertically by the heat shield ring via a cylindrical holder ring in a manner such that the lower end of the quartz partition ring comes substantially lower than the lower end of the purge tube so that, by being dipped in the polycrystal melt, the partition ring isolates the interior surface of the melt from the exterior surface of the melt, over which latter the granular polycrystal material is poured.

Preferably, the cylindrical quartz partition ring is cut from a transparent quartz glass tube obtained by electric fusion method conducted in vacuum, or a quartz glass tube obtained by depositing and fusing quartz particles on the inner and outer surfaces of a tubular substrate of quartz glass to thereby coat the tubular substrate with layers of transparent quartz glass in a high temperature inert gas atmosphere prepared by electric discharging.

Furthermore, the cylindrical quartz partition ring of the apparatus has a height of not greater than 80 mm.

Preferably, the cylindrical holder ring is formed with penetrating gas escape holes, and more preferably, the sum of the areas of said gas escape holes satisfies the following inequality:

$$S >> \pi \times D \times h$$

wherein D is the diameter of the heat shield ring at the truncated lower end, and h is the distance between the lower end of the heat shield ring and the melt surface.

According to another aspect of the invention, there is provided a method for growing and pulling up a single crystal ingot, comprising the steps of (a) lowering the purge tube until the quartz partition is partially dipped in the polycrystal melt thereby isolating the interior surface of the polycrystal melt from the exterior surface of the melt; (b) sending an inert gas down in the purge tube, (c) pulling up the single crystal ingot; (d) continuously supplying the granular polycrystal material through the conduit at the location of the exterior surface of the melt to supplement the polycrystal melt.

(Effects of the Invention)

According to the invention, in a single crystal pulling apparatus, the cylindrical quartz partition ring dipped in the melt divides the interior of the quartz crucible into the internal single crystal growth region and the external raw material supply region, so that, like in the case of the conventional duplex crucible method, the quartz partition ring confronts the surface convection caused by the internal thermal convection thereby checking the floating powdery polycrystal from approaching the single crystal ingot, and furthermore the partition ring prevents the thermal disorder in the melt thereby further minimizing the crystal dislocation. Also, since the oxygen dissolved in the melt from the inner wall of the quartz crucible cannot easily arrive at the growth interface, the uniformity of oxygen concentration in the grown crystal is improved.

In addition to these, since the quartz partition ring is made of such quartz glass that contains no bubbles therein, even when the quartz partition ring is dipped in the super-hot melt, the partition ring undergoes no deformation that would be caused by the expansion of bubbles; consequently, even if that portion of the quartz partition ring that is dipped in the melt corrodes, the surface of the quartz partition ring remains smooth so that fragments of quartz glass scarcely drop from the surface of the partition ring, whereby the dislocation of the single crystal is further prevented and the single crystal of high quality is obtained.

Especially, in the present invention the cylindrical quartz partition ring is cut from a quartz glass tube which is either a transparent quartz glass tube obtained by electric fusion method conducted in vacuum, or a quartz glass tube obtained by depositing and fusing quartz particles on the inner and outer surfaces of a tubular substrate of quartz glass to thereby coat the tubular substrate with layers of transparent quartz glass in a high temperature inert gas atmosphere prepared by electric discharging; therefore, no oxygen or hydrogen gas is used unlike the oxyhydrogen flame fusion method, so that it is possible to obtain a kind of quartz which contains extremely small amount of OH group, which weakens the mechanical strength of the resulting quartz glass tube; hence the quartz partition ring made from such quartz glass tube undergoes relatively minor deformation when it is dipped in the melt 12A, and consequently, it becomes possible to conduct a long-period continuous operation such as multi-pooling.

Incidentally, Japanese Patent Kokai No. 1-148718 (Title of the Invention: A Quartz Glass Crucible and a Method for Manufacturing the Same) discloses a technology according to which only the inner surface of the quartz crucible is coated with a transparent quartz glass layer. If this technology is adopted for coating of the inner and outer surfaces of the quartz glass tube used as the substrate for quartz particle deposition, it is possible to obtain the cylindrical partition ring of the present invention. The transparent quartz glass layer formed by means of electric discharging contains as small an amount of OH group as the quartz glass obtained by the electric fusion method, so that by employing the electric discharging technique, it is also possible to obtain nearly perfectly bubble-free transparent glass layer, and by setting the temperature of the atmosphere in which the electric discharging is conducted, it is possible to reduce the OH group content in the resulting transparent quartz glass layer. Also, if high purity quartz particles such as synthetic silica glass powder are used for the quartz particles, the purity of the resulting quartz glass layer will be remarkably improved.

In order to obtain the desired effect, it suffices to dip the quartz partition ring in the melt by a depth of 20–50 mm, and therefore the height of the ring can be as small as 50–80 mm, even after allotting some portion for connection purpose; consequently, the material cost as well as the tooling cost for the quartz partition ring is not high. Also, since the portion of the partition ring submerged in the melt is small so that the concentration of interstitial oxygen in the crystal can be reduced.

Furthermore, the radiant heat radiated from the melt surface is reflected back by the inclined outer face of the heat shield ring and thereby the reflection heats the portion including the interface joining the internal crucible and the melt surface whereby the unfavorable solidification of the melt at said interface is prevented; as the result, it is possible to increase the single crystal growth rate, and thus improve the productivity. Furthermore, the inclined outer face of the heat shield ring is heated by the heat radiation from the melt surface, and the reflected heat prevents the cylindrical holder ring and an upper portion of the cylindrical quartz partition ring from cooling thereby preventing deposition thereon of the silicon monoxide (SiO) evaporated from the melt surface, and thus the turbulence in the growth of the single crystal is minimized. Incidentally, the angle of the inclined outer face of the heat shield ring formed with horizontal plane is preferably 30°–45° to optimize the heating effect of the reflected radiant heat.

This preferred angle range of 30°–45° to be formed between the heat shield ring and horizontal plane is also desirable in that such angles will effectively prevent deposition of SiO evaporated from the melt surface on the cylindrical holder ring, especially its inner wall, and on the inner side of the upper wall of the quartz crucible, as the inert gas such as At, having been forced down in the carbon purge tube, flows across the melt surface and flows out through the gas escape holes of the holder ring. Of course, the SiO evaporated from the melt surface is carried by this inert gas flow and enters the heating chamber through the gas escape holes of the holder ring; then, it is led out of the quartz crucible and eventually out of the heating chamber.

The construction of the assembly consisting of the heat shield ring, cylindrical holder ring, and quartz partition ring is such that no deposition of SiO takes place on the external walls of these rings. The vicinities of the growth interface of the single crystal is cooled by the inert gas, and since this cooling is helped by the insulation effect of the heat shield ring, it is possible to increase the single crystal growth rate.

The present invention will become more fully understood from the detailed description given hereinbelow and the accompanying drawings which are given by way of illustration only, and thus are not limitative of the present invention.

EMBODIMENTS

An embodiment of the invention will be described with reference to the attached figures.

Figure 1:
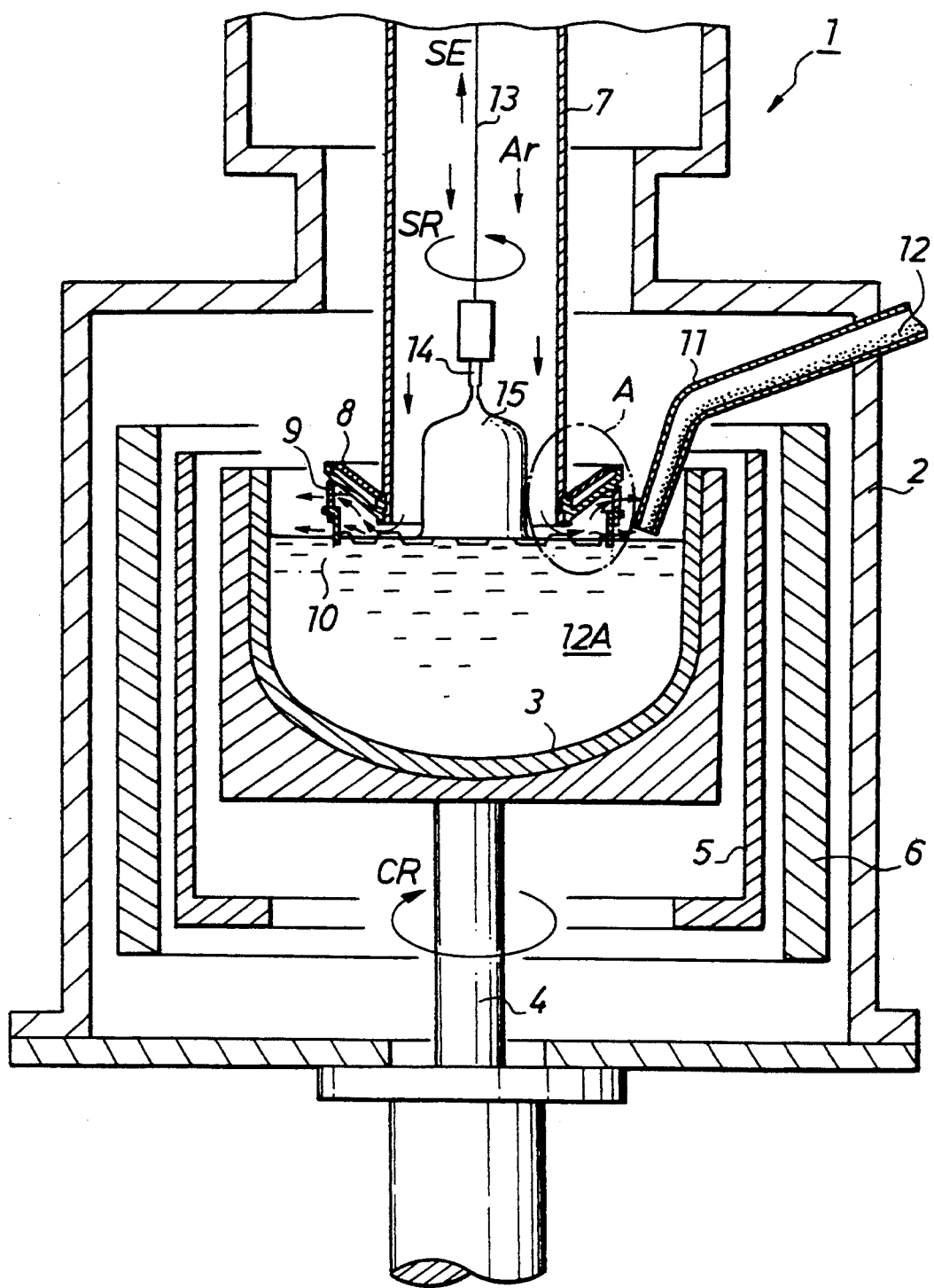
FIG. 1 is a vertical sectional drawing showing the construction of a single crystal pulling apparatus according to the invention.
Figure 2:
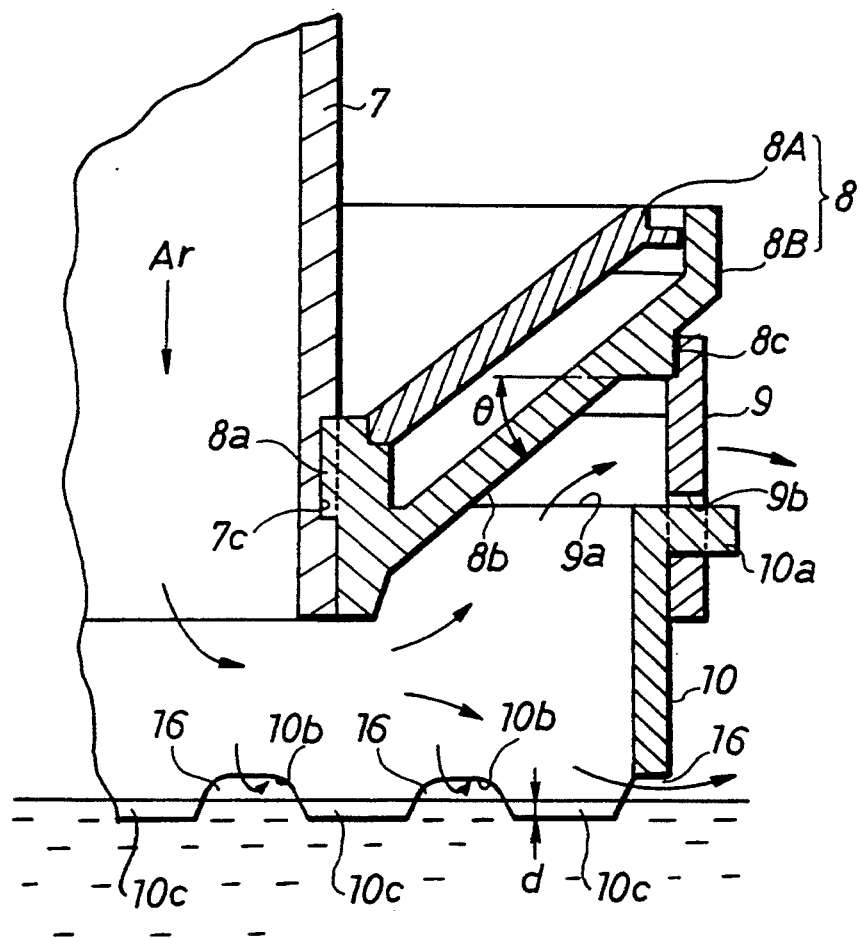
FIG. 2 is an enlarged view of the section A of FIG. 1.
Figure 3:
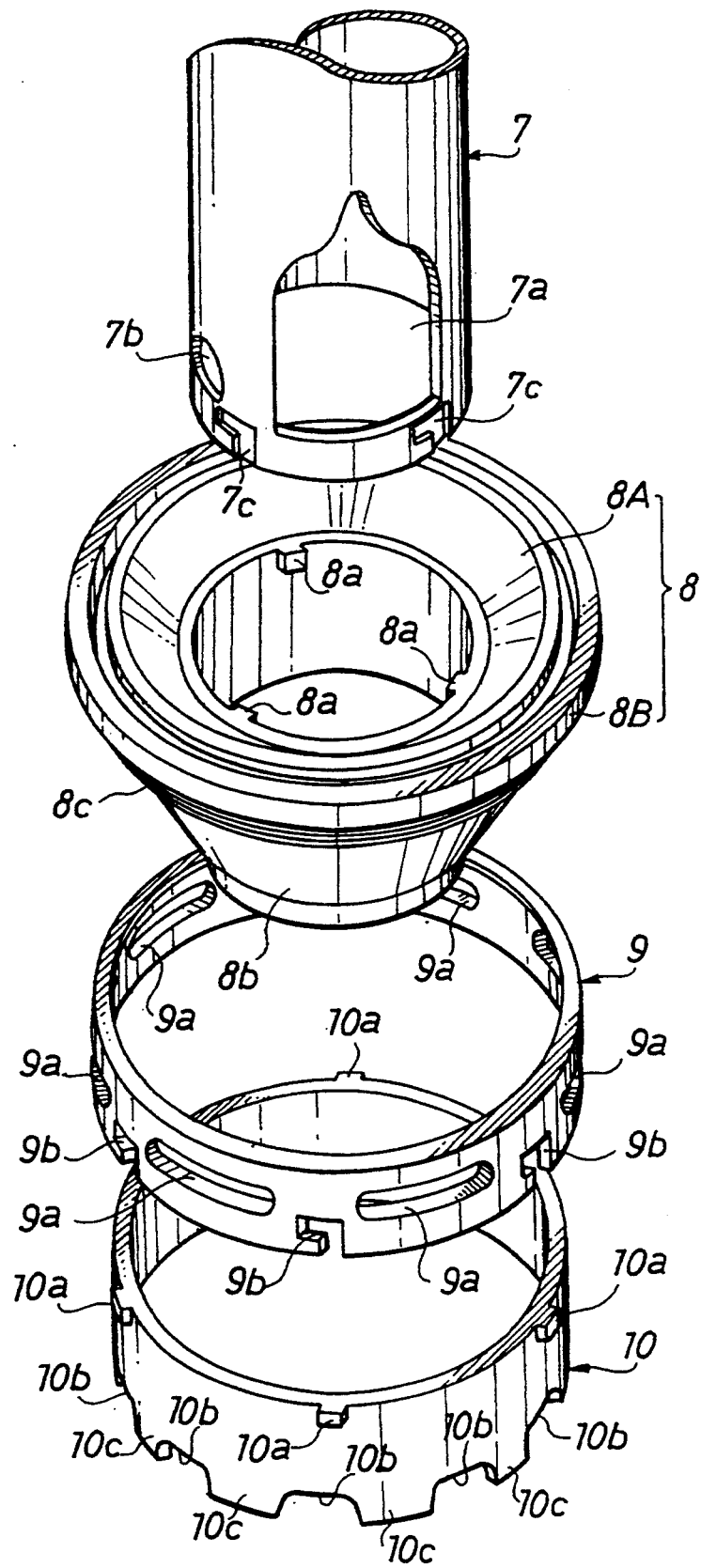
FIG. 3 is an exploded perspective view of the portion of the single crystal pulling apparatus wherein lies the improvement of the present invention.

FIG. 1 is a vertical cross-sectional drawing of a single crystal pulling apparatus embodying the invention; FIG. 2 is an enlarged view of the section A of FIG. 1; and FIG. 3 is an exploded perspective view of that portion of the single crystal pulling apparatus where improvements are made.

In FIG. 1, the reference numeral 2 designates a main chamber (heating chamber) framed by a stainless cylinder. Inside the heating chamber 2 is a crucible assembly which consists of an internal quartz crucible 3 and an external graphite crucible, and is fixed on top of a vertical crucible shaft 4, which is adapted to turn about its axis and shift vertically by means of a drive mechanism, not shown.

Encompassing these crucibles are a cylindrical heater 5 made of carbon and a cylindrical heat shield 6 also made of carbon, the latter 6 surrounding the former 5.

As shown in FIG. 1, a purge tube 7 made of carbon is suspended from an upper chamber and disposed into the heating chamber 2 in a manner such that the tube 7 can be shifted vertically by means of a drive mechanism, not shown. The purge tube 7 is for providing a passage for a purge gas such as argon, and has a diameter large enough to allow the grown single crystal ingot to rise up therein. The purge tube 7 carries a heat shield ring 8 made of carbon at the lower end. A cylindrical holder ring 9 made of carbon is screwed on the outer side of the heat shield ring 8, and a cylindrical quartz partition ring 10 having a height of 80 mm or smaller is held by the cylindrical holder ring 9.

Now, the connection of the heat shield ring 8, the cylindrical holder ring 9, and the cylindrical quartz partition ring 10 will be described with reference to FIGS. 2 and 3.

As shown in FIG. 3, the purge tube 7 is formed with a large peep hole 7a and a small peep hole 7b, and in the external surface of the purge tube 7 at the lower end are formed three crooked grooves 7c. Incidentally, the small peep hole 7b is for an image sensor to peep for diameter measurement.

The heat shield ring 8 is composed of a funnel-shaped inner ring 8A and a similar outer ring 8B. Three bosses 8a are formed to protrude from the inner and lower periphery of the outer ring 8B (ref. Fig. 3), and these bosses 8a are adapted to engage with the respective crooked grooves 7c of the purge tube 7, whereby the heat shield ring 8 is supported at the lower end of the purge tube 7.

Incidentally, the outer ring 8B, which diverges upward, has an inclined outer face 8b, which forms an angle $\theta$(30°–45°) with horizontal plane (ref. FIG. 2). An annular horizontal step 8c is formed to protrude from the outer face 8b, and the cylindrical holder ring 9 is screwed on this step 8c in a manner such that the direction of the screwing is opposite to the direction in which the quartz crucible 3 is turned lest the holder ring 9 should be loosened from the heat shield ring 8 as the crucible 3 is turned and solidification of the melt on the quartz partition ring 10 occurs.

Also, the cylindrical holder ring 9 is formed with six gas escape holes 9a and six crooked holes 9b, and the sum S of the areas of the six gas escape holes 9a satisfies the following inequality:

$$S \gg \pi \times D \times h$$

wherein D is the diameter of the heat shield ring 8 at its lower end, and h is the distance between the lower end of the heat shield ring 8 and the melt surface. Incidentally, in the present embodiment, the heat shield ring 8 and the cylindrical holder ring 9 are entirely coated with SiC.

Furthermore, six bosses ring 10a are formed to protrude horizontally from the upper periphery of the cylindrical quartz partition ring 10, and when these bosses 10a are engaged with the crooked holes 9b of the cylindrical holder ring 9, the quartz partition ring 10 is held by the cylindrical holder ring 9.

The cylindrical partition ring 10 is cut from a quartz glass tube, and this quartz glass tube is either a transparent quartz glass tube obtained by electric fusion method conducted in vacuum, or a quartz glass tube obtained by depositing and fusing quartz particles on the inner and outer surfaces of a tubular substrate of quartz glass to thereby coat the substrate with layers of transparent quartz glass in a high temperature gas atmosphere prepared by electric discharging.

Next, the operation of the single crystal pulling apparatus 1 of the invention will be described.

In growing a single crystal ingot, such as silicon, the atmosphere in the pulling apparatus 1 is made non-oxidizing: the air is drawn out from the chamber 2, and argon gas is supplied and the pressure in the chamber 2 is kept low (e.g., 30 millibar); granular polycrystal silicon (herein after "polysilicon") 12 is charged into the quartz crucible 3 by way of a raw material supply conduit 11; then the polysilicon in the crucible 3 is heated and melted down by the heater 5 to form a molten liquid (melt) 12A.

Then, the purge tube 7 together with the quartz partition ring 10, etc. is lowered until the quartz partition ring 10 is partially dipped in the melt 12A in the quartz crucible 3, as shown in FIG. 1. Next, a pull wire 13 hanging in the purge tube 7 is lowered until the seed crystal 14 fixed at the lower end of the wire 13 is dipped in the melt 12A contained in the quartz crucible 3.

Next, the crucible shaft 4 and the crucible assembly supported thereon are caused to rotate about their common axis of rotation at a predetermined rate in the clockwise direction CR. Simultaneously with this, the wire 13 together with the seed crystal 14 is caused to spin at a predetermined rate in the counterclockwise direction SR, and to rise at a predetermined rate SE. As a result, a single crystal ingot 15 grows from the seed crystal 14 provided at the lower end of the pull wire 13, as shown in FIG. 1.

As the single crystal pulling operation proceeds, argon gas is sent down in the purge tube 7, and it escapes from the purge tube 7 and enters the chamber 2 by way of the six gas escape holes 9a formed in the holder ring 9. Eventually, the argon gas is discharged from the chamber 2 carrying the SiO gas evaporated from the surface of the melt 12A. Thus, by virtue of the Ar gas flow in the purge tube 7, the SiO gas is effectively carried out of the chamber 2 so that the occurrence of dislocation in the single crystal 15 caused by SiO is minimized. Since the growth interface where single crystal grows is forced to cool by the argon gas flow, it is possible to increase the growth rate (pulling rate) SE of the single crystal 15 without lowering the temperature of the melt 12A. Incidentally, the sum S of the areas of the six gas escape holes 9a is set to a value as specified above so that the argon gas escapes smoothly from the purge tube 7 to the same extent as if there were no quartz partition ring 10 dipped in the melt 12A.

Furthermore, the radiant heat radiated from the melt surface is reflected by the inclined outer face 8b of the heat shield ring 8 and thereby the reflection heats the portion including the interface joining the internal crucible and the melt surface whereby the unfavorable solidification of the melt 12A at said interface is prevented. As the result, it is possible to further the growth rate (pulling rate) SE of the single crystal 15, and thus the productivity is increased. Incidentally, the heat shield ring 8 and the cylindrical holder ring 9 are always subjected to the ultra-high temperature of 1400° C. or higher, but since they are entirely coated with SiC, as described above, their thermal resistivity at ultra-high temperatures is reinforced so that they do not undergo degradation to drop carbon fragments; therefore, smooth growth of the single crystal 15 is not disturbed by the carbon fragments.

In the present embodiment, the quartz partition ring 10 dipped in the melt 12A divides the interior of the quartz crucible 3 into the internal single crystal growth region and the external raw material supply region, so that, like in the case of the conventional duplex crucible method, the quartz partition ring 10 confronts the surface convection caused by the internal thermal convection thereby checking the floating powdery polycrystal from approaching the single crystal ingot, and furthermore the partition ring 10 prevents the thermal disorder in the melt 12A in the vicinity of the single crystal thereby further minimizing the crystal dislocation. In addition to these, since the quartz partition ring 10 is made of such quartz glass that contains no bubbles therein, even when the quartz partition ring 10 is dipped in the super-hot melt 12A, the partition ring 10 undergoes no deformation that would be caused by the expansion of bubbles; consequently, even if that portion of the quartz partition ring 10 that is dipped in the melt 12A corrodes, the surface of the quartz partition ring 10 remains smooth so that fragments of quartz glass scarcely drop from the partition surface, whereby the dislocation of the single crystal is further prevented and the resulting single crystal 15 of high quality is obtained.

Especially, in the present embodiment the cylindrical quartz partition ring 10 is cut from a quartz glass tube which is either a transparent quartz glass tube obtained by electric fusion method conducted in vacuum, or a quartz glass tube obtained by depositing and fusing quartz particles on the inner and outer surfaces of a tubular substrate of quartz glass to thereby coat the tubular substrate with layers of transparent quartz glass in a high temperature gas atmosphere prepared by electric discharging. Since in either method of preparing the quartz glass tube, no oxygen or hydrogen gas is used unlike the oxyhydrogen flame fusion method, so that it is possible to obtain a kind of quartz which contains extremely small amount of OH group, which weakens the mechanical strength of the resulting quartz glass tube; hence the quartz partition ring 10 made from such quartz glass tube undergoes relatively minor deformation when it is dipped in the melt 12A, and consequently, it becomes possible to conduct a long-period continuous operation such as multi-pooling.

The quartz partition ring 10, constituting the internal crucible, is dipped only partially in the melt 12A so that its height can be small (e.g. 5 cm) and thus the thermal deformation can be small and the thermal resistivity increased; consequently the material cost as well as the tooling cost for the quartz partition ring 10 is not high. Also, since the quartz partition ring 10, connected indirectly to the purge tube 7, is adapted to shift vertically, in the case where the melt amount is controlled to be reduced, the quartz partition ring 10 has only to be lowered correspondingly as the lowering of the level of the melt surface, in order that the area by which the melt contacts the crucible is maintained roughly constant, whereby the oxygen concentration in the melt 12A is maintained fixed.

During the time when the single crystal 15 is pulled up, the granular polysilicon 12 is continuously charged into the quartz crucible 3, and since it is poured at a location outside the quartz partition ring 10, the granule 12 does not reach and stick to the single crystal 15 as it is dropped onto the melt 12, and also, as the quartz partition ring 10 is dipped in the melt 12A, the surface convection of the melt 12A that goes toward the single crystal 15 is checked and thus it is possible to conduct a stable and continuous supply of the polysilicon 12 outside the quartz partition ring 10, and as the result, the resistivity of the single crystal 15 becomes uniform in the direction of the growth axis.

Furthermore, in the present embodiment, as described above, since the cylindrical holder ring 9 is screwed on the heat shield ring 8 in a manner such that the direction of the screwing is opposite to the direction in which the quartz crucible 3 is turned, even when the melt 12A solidifies on the quartz partition ring 10, the holder ring 9 is not unscrewed from the heat shield ring 8 as the crucible 3 is turned.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A method based on Czochralski technique for growing and pulling up a single crystal ingot from a polycrystal melt contained in a quartz crucible provided in a heating chamber, in which are also provided a heater, a thermal insulator, a conduit for continuously supplying granular polycrystal material to the crucible, a vertical purge tube suspended centrally into the heating chamber from above to provide a passage for purge gas, and a cylindrical quartz partition ring concentric with and connected to the lower end of said purge tube and made of a quartz glass containing no bubbles therein; the method comprising the steps of
   (a) lowering the vertical purge tube until said cylindrical quartz partition ring is partially dipped in the polycrystal melt thereby isolating an interior surface of the polycrystal melt from an exterior surface of the melt;
   (b) sending an inert gas down in the purge tube and across said interior surface of said melt;
   (c) pulling up the single crystal ingot;
   (d) supplying the granular polycrystal material through said conduit at the location of said exterior surface of the melt to supplement the polycrystal melt.

2. A single crystal pulling apparatus for growing and pulling up a single crystal ingot from a polycrystal melt contained in a quartz crucible provided in a heating chamber, in which are also provided a heater, a thermal insulator, a conduit for continuously supplying granular polycrystal material to the crucible, and a vertical purge tube suspended centrally into the heating chamber from above to provide a passage for a purge gas, said single crystal pulling apparatus further including
   means for vertically shifting said purge tube;
   a heat shield ring concentric with the purge tube and connected to the lower end of said purge tube, said heat shield ring having a shape of a truncated cone expanding upward from its lower end where it is connected to the purge tube such that an inclined outer face of said heat shield ring forms a substantial angle with a horizontal plane; and
   a cylindrical quartz partition ring concentric with said purge tube and made of quartz glass containing no bubbles therein and held vertically by said heat shield ring via a cylindrical holder ring in a manner such that the lower end of the quartz partition ring extends substantially lower than the lower end of said purge tube so that, by being partially dipped in the polycrystal melt while the lower end of said purge tube remains above a surface of said melt, the partition ring isolates an interior surface of the melt from an exterior surface of the melt, over which granular polycrystal material is poured.

3. The single crystal pulling apparatus as claimed in claim 2, wherein said cylindrical quartz partition ring is cut from a transparent quartz glass tube obtained by electric fusion method conducted in vacuum.

4. The single crystal pulling apparatus as claimed in claim 2, wherein said cylindrical quartz partition ring is cut from a quartz glass tube obtained by depositing and fusing quartz particles on the inner and outer surfaces of a tubular substrate of quartz glass to thereby coat the tubular substrate with layers of transparent quartz glass in a high temperature gas atmosphere prepared by electric discharging.

5. The single crystal pulling apparatus as claimed in claim 2, wherein said cylindrical quartz partition ring has a height of from 50 to 80 mm.

6. The single crystal pulling apparatus as claimed in claim 2, wherein said inclined outer face of said heat shield ring forms an angle of 30–45 degrees with horizontal plane.

7. The single crystal pulling apparatus as claimed in claim 2, wherein said cylindrical holder ring is formed with penetrating gas escape holes.

8. The single crystal pulling apparatus as claimed in claim 7, wherein the sum of the areas of said gas escape holes satisfies the following inequality:

$$S > > \pi \times D \times h$$

wherein D is the diameter of the heat shield ring at the truncated lower end, and h is the distance between the lower end of the heat shield ring and the melt surface.

9. The single crystal pulling apparatus as claimed in claim 2, wherein said cylindrical holder ring is screwed on the heat shield ring in a manner such that the direction of the screwing is opposite to the direction in which the crucible is turned.

10. The single crystal pulling apparatus as claimed in claim 2, wherein the entire surfaces of the heat shield ring and the cylindrical holder ring are coated with SiC.

* * * * *